US012575058B2

(12) United States Patent
Edmunds et al.

(10) Patent No.:  US 12,575,058 B2
(45) Date of Patent:      Mar. 10, 2026

(54) DIELECTRIC COOLANT DISTRIBUTION MANIFOLD

(71) Applicant: ICEOTOPE GROUP LIMITED, South Yorkshire (GB)

(72) Inventors: Neil Edmunds, South Yorkshire (GB); David Amos, South Yorkshire (GB)

(73) Assignee: ICEOTOPE GROUP LIMITED, South Yorkshire (GB)

( * ) Notice: Subject to any disclaimer, the term of this patent is extended or adjusted under 35 U.S.C. 154(b) by 153 days.

(21) Appl. No.: 18/267,468

(22) PCT Filed: Dec. 14, 2021

(86) PCT No.: PCT/GB2021/053285

§ 371 (c)(1),
(2) Date: Jun. 15, 2023

(87) PCT Pub. No.: WO2022/129889

PCT Pub. Date: Jun. 23, 2022

(65) Prior Publication Data

US 2024/0098944 A1      Mar. 21, 2024

(30) Foreign Application Priority Data

Dec. 18, 2020    (GB) ..................................... 2020109

(51) Int. Cl.
*H05K 7/20*          (2006.01)
*G06F 1/20*          (2006.01)
*H05K 1/02*          (2006.01)

(52) U.S. Cl.
CPC ..... *H05K 7/20236* (2013.01); *H05K 7/20772* (2013.01); *G06F 1/20* (2013.01);
(Continued)

(58) Field of Classification Search
CPC ........... H05K 7/20236; H05K 7/20263; H05K 7/20272; H05K 7/20772; H05K 1/0203; H05K 2201/064; G06F 1/20
See application file for complete search history.

(56) References Cited

U.S. PATENT DOCUMENTS 4,839,774 A      6/1989   Hamburgen
5,067,047 A  *  11/1991   Azar .................. H05K 7/20345
                                                            361/691
(Continued)

FOREIGN PATENT DOCUMENTS

JP            5956098  B1      7/2016
WO         2009040366          4/2009
(Continued)

OTHER PUBLICATIONS

International Search Report and Written Opinion for Application No. PCT/GB2021/053285, date of mailing Mar. 18, 2022, 13 pages.
(Continued)

*Primary Examiner* — Zachary Pape
(74) *Attorney, Agent, or Firm* — Bochner PLLC; Andrew D. Bochner

(57)                    ABSTRACT
A manifold is provided for distribution of dielectric coolant within a chassis, to allow the dielectric coolant to receive heat from at least one electronic component mounted within the chassis. The manifold comprises: a circuit board, having first and second opposing surfaces; and a substrate, at least partially spaced apart from the circuit board and a gap between a first surface of the circuit board and the substrate being configured to receive and contain dielectric coolant. One or more apertures are provided in the circuit board or substrate to allow dielectric coolant contained in the gap to flow across the opposing surfaces of the circuit board or substrate.

19 Claims, 13 Drawing Sheets

(52) U.S. Cl.
    CPC ....... *H05K 1/0203* (2013.01); *H05K 7/20263*
                (2013.01); *H05K 7/20272* (2013.01)

(56)                    References Cited

U.S. PATENT DOCUMENTS

| | | | | |
|---|---|---|---|---|
| 5,166,775 | A | 11/1992 | Bartilson | |
| 5,959,351 | A * | 9/1999 | Sasaki | H01L 23/473 |
| | | | | 257/E23.098 |
| 6,262,891 | B1 * | 7/2001 | Wickelmaier | H05K 7/20909 |
| | | | | 174/15.1 |
| 7,495,914 | B2 * | 2/2009 | Tilton | H01L 23/4735 |
| | | | | 361/689 |
| 8,077,464 | B2 * | 12/2011 | Brok | H01L 23/467 |
| | | | | 361/698 |
| 10,638,637 | B2 * | 4/2020 | Edlinger | F21S 45/47 |

FOREIGN PATENT DOCUMENTS

| | | | |
|---|---|---|---|
| WO | | 2016044246 | 3/2016 |
| WO | | 2020068272 | A1 | 4/2020 |

OTHER PUBLICATIONS

Search Report for Application No. GB2020109.1, date of mailing
Jun. 15, 2021, 4 pages.
Office Action of the Japan Patent Office in related Japanese Appl.
No. 2023-537033, dated May 27, 2025, 9 pages.

* cited by examiner

DIELECTRIC COOLANT DISTRIBUTION MANIFOLD

TECHNICAL FIELD OF THE DISCLOSURE

The disclosure concerns a manifold for distribution of dielectric coolant within a chassis to allow the dielectric coolant to receive heat from at least one electronic component mounted within the chassis. It further concerns a cooling module comprising such a manifold.

BACKGROUND TO THE DISCLOSURE

Computers, servers, and other devices used for data processing (referred to as Information Technology or IT) typically comprise printed circuit boards (PCBs). On these PCBs are small devices called Integrated Circuits (IC), which may include central processing units (CPUs), Application Specific Integrated Circuits (ASICs), Graphical Processing Units (GPUs), Random-Access Memory (RAM), etc. All of these electronic components or devices generate heat when in use. In order to maximise the performance of the IT, heat should be transferred away, in order to maintain the contents at an optimal temperature. Heating of the electrical components to high temperatures can also cause damage, affect performance or cause a safety hazard. These considerations also apply to other types of electronic devices or systems.

IT is usually housed within a case, enclosure or housing. In a server for instance, this enclosure is sometimes referred to as the server chassis, although the term "chassis" is used herein to relate to any type of overall housing used for electronic components. A server chassis typically adheres to a number of industry standards that specify the height of each chassis, referred to as 1RU (one rack unit) or 1OU (one open unit), these are also abbreviated to 1U or 1OU. The smaller of the 2 main standards is the 1RU/1U, which is 44.45 mm or 1.75 inches in height. Such units are sometimes referred to as a "blade" server in the sense of shape and style, although it may not be necessary for such a server chassis to slot or plug into a backplane, for example.

Different server products can utilise more than one RU/OU at a time for the chassis, for example a 2U chassis uses 2 rack units. The size of each server chassis is usually kept to a minimum to maximise the amount of computing power per server rack (a server rack is the main housing that server chassis are added to).

Typically, the electronic components or devices that are used on or in IT are cooled using air. This usually includes a heatsink of some kind with fins or similar being placed in contact with the chip surface either directly, or with a TIM (thermal interface material) between the two components. In addition to the heat sink, each enclosure uses a series of fans to pull air through the enclosure, removing heat from the heatsink and expelling it from the chassis. This type of heat sink is used in combination with cooling at the server facility side, such as air conditioning. This method of cooling is not especially efficient, has a high running cost, and uses large amounts of space for managing the air used for cooling.

This method of cooling IT has been used almost exclusively for mass-manufactured IT and server equipment. However, in more recent times, the peak performance of the heat generating chips has been throttled due to the limitations of cooling a device with air. As technology halves in size for the same performance every couple of years (as exemplified in Moore's law), the heat produced by chips is increasing as the footprint of the component decreases. This has seen an increase in the size and complexity of heatsinks designed for air cooling. As a result, there is often an increase in the required server chassis size, thus decreasing the computing power within a single rack.

As an alternative to air cooling, liquid cooling can be used. Although different liquid cooling assemblies have been demonstrated, in general the electrical components are immersed in a coolant liquid so as to provide a large surface area for heat exchange between the heat generating electrical components and the coolant. Such systems may use a single phase coolant, in which case the coolant remains in liquid phase or a phase-change coolant, where the liquid coolant evaporates and must be condensed for continuous, effective cooling.

International Patent publication WO-2018/096362 (commonly assigned with the present disclosure) describes a cooling system in which a primary dielectric coolant liquid is provided within a chassis and used to cool electronic components housed within. The primary dielectric coolant liquid is pumped to a heat exchanger, where heat is transferred to a secondary liquid coolant. The heat exchanger is provided within the chassis and the secondary liquid coolant, which is typically water or water-based (advantageous as having a high specific heat capacity), is pumped to the chassis and the heat exchanger within, before then being pumped out of the chassis and may be shared between multiple chassis. Pipes that end with nozzles are provided for conveying the primary dielectric coolant from the heat exchanger to the electronic components being cooled.

International Patent publication WO-2019/048864 describes heat sinks and heat sink arrangements for an electronic device. Such a heat sink may allow a primary dielectric coolant to be accumulated adjacent a specific electronic component, thereby cooling the electronic component effectively. The coolant may flow out of the heat sink, by overflowing the heat sink and/or by one or more apertures in the heat sink, and join the remainder of the coolant in the chassis that cools other electronic components within. In this way, multiple levels of coolant may be provided and the total quantity of coolant required may be minimized. Pipes that end with nozzles are provided for conveying the primary dielectric coolant from a heat exchanger to each heat sink.

In such designs, the dielectric coolant leaving the heat exchanger may be split into different paths (each defined by a respective pipe or hose) in a manifold. Each path conveys the dielectric coolant to a respective electronic component or a heat sink associated with that component. For example, some paths may feed a heat sink mounted on the hottest components, whilst other paths may feed the dielectric coolant to components mounted within a heat sink structure.

The routing of the dielectric coolant can therefore be complicated. It is desirable to convey dielectric coolant more effectively, particularly from a heat exchanger to electronic components being cooled.

SUMMARY OF THE DISCLOSURE

Against this background, there is provided a manifold for distribution of dielectric coolant within a chassis to allow the dielectric coolant to receive heat from at least one electronic component mounted within the chassis in accordance with claim 1 and a cooling module in line with claim 19. Further preferable and/or advantageous features are identified in the dependent claims and in the remaining disclosure herein. A method of manufacturing and/or operating a manifold and/or a cooling module having steps corresponding with the structural features described herein may also be considered.

A key realisation of the present disclosure is that a circuit board (or equivalently a printed circuit board, PCB) may be used to form a manifold. A substrate, for instance a part of a chassis in which the manifold is housed or a gear tray may provide a second surface and dielectric coolant can accumulate in a gap or cavity formed between the PCB and substrate. Apertures (although in principle, there may be only one) in the circuit board or substrate allow dielectric coolant to pass from the cavity to cool electronic components on, above or around the circuit board.

The holes can be added to the circuit board to deliver coolant directly to the components. The hole size and position can be designed and/or optimised to achieve the a desired flow rate, flow balance and/or flow location.

The circuit board may have one or more electrical interfaces, each for providing one or multiple electrical connections to an electronic component mounted thereupon. These are typically located based on electrical component layout. The apertures may be located with respect to the electrical interfaces to allow efficient flow of dielectric coolant to the electronic components. For example, if the electrical interfaces are regularly-spaced (for example, for memory boards or other aligned components), apertures may be arranged between the electrical interfaces (for example in a regular pattern). This may facilitate flow of coolant. A gasket may seal the circuit board and the substrate to define the gap or cavity and this may optionally be shaped to direct flow of the dielectric coolant in the gap.

Fluid connectors (although again, there may only one), may each be arranged on or above the circuit board at a respective aperture. This may allow connections from the aperture to a part for receiving the dielectric coolant, for example a heat sink. A coolant inlet may receive a conduit carrying the dielectric coolant (for instance from a heat exchanger) to allow the dielectric coolant to enter the gap. The coolant inlet may be mounted on a hole in the circuit board (for example, the same surface on which electronic components are mounted, opposite the cavity) or the substrate and the hole is typically larger than each of the one or more apertures.

In some embodiments, a support structure may be mounted on or to the circuit board. The support structure may provide one or more support structure volumes (for instance, a bay) and one or more electronic components may be mounted within. This may be useful for mounting disk drives. Each volume may have one or more electrical interfaces to allow a component (or components) to be mounted within. Multiple apertures may allow dielectric coolant into each volume. The support structure and circuit board together allow (at least partially seal) these volumes so that dielectric coolant accumulates within and can thereby cool any electronic components in the volume. Advantageously, the accumulated dielectric coolant may overflow.

Embodiments may include one or more heat sinks. Each heat sink may have a receptacle structure with an internal volume adjacent the electronic component (sometimes termed a "bath"). A conduit (a pipe, hose and/or nozzle) may direct dielectric coolant from an aperture to the internal volume. The dielectric coolant may accumulate in the internal volume and preferably overflow. The electronic component (or components) may be underneath, the internal volume coupled to a side (for instance, a sidewall) of the internal volume or the electronic component (or components) may be within the internal volume. In this way, dielectric coolant can be fed through the circuit board to the base of a bath heat sink. In existing bath heat sinks, the bath is fed from a hose that sits on the top of the bath. It can be difficult to get dielectric coolant straight from the heat exchanger (that is, the coolest) to the bottom of the bath when feeding the bath from the top. By introducing the coolant to the base of the bath through the circuit board, the cool dielectric coolant passes all the heat emitting components as it travels to the top of the bath to overflow. This advantages also apply to the support structure, discussed above. Since there is no need for additional manifolds, any conduit (pipe or hose) between the circuit board and the bath is short and can have a much better (simpler) routing than existing approaches.

In embodiments, an electronic component (or components) may be mounted in the manifold cavity, for example.

The electronic component (or components) may be one of: an integrated circuit; a power supply; a RAM component; and a disk drive component, for instance.

The manifold may form part of a cooling module, for example a standalone unit or for mounting in a server rack. The cooling module may have a chassis, with electronic components mounted therein, for example on or above the circuit board of the manifold. The circuit board of the manifold is generally oriented parallel or perpendicular to a base of the chassis. The manifold may receive dielectric coolant (for example from a heat exchanger) and direct it for cooling one or more of the electronic components. The heat exchanger (generally within the chassis) may transfer heat from the dielectric coolant to a heat sink (for instance, an external secondary liquid coolant) and direct the cooled dielectric coolant to the manifold. The dielectric coolant may flow from the heat exchanger to the manifold due to a pump, typically upstream from the manifold.

This approach is particularly useful in cases where access to components may not be possible without removing hoses. It would be advantageous to have quick release (hot swappable) pumps, but the shared space with the coolant manifold can make this difficult. Approaches according to the disclosure may permit quick release connections to the pumps.

In operation, dielectric coolant may flow out of the manifold and accumulate in an internal volume of the chassis, where it may cool other electronic components, for example mounted on the circuit board or one or more other circuit boards. Generally, the level of coolant accumulated is lower than a height of the support structure volume and/or heat sink internal volume.

BRIEF DESCRIPTION OF THE DRAWINGS

The disclosure may be put into practice in a number of ways and preferred embodiments will now be described by way of example only and with reference to the accompanying drawings, in which.

Like features are denoted by the same reference numerals throughout. All drawings may be understood as schematic in nature.

DETAILED DESCRIPTION OF PREFERRED EMBODIMENTS

Figures 1A, 1B, 1C:
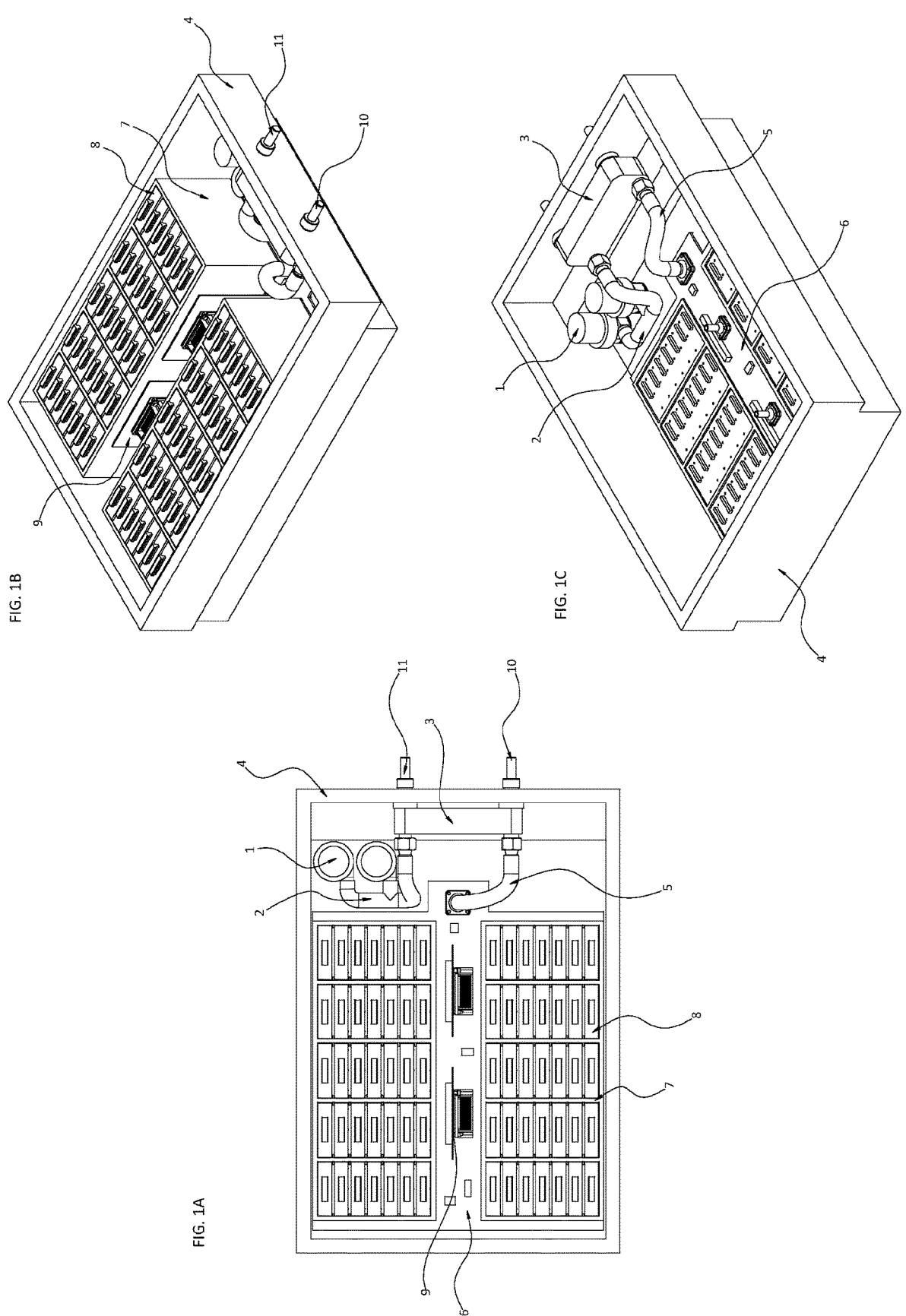
FIG. 1A depicts a plan view of a full chassis assembly according to a first embodiment.
FIG. 1B shows a rear isometric view of the embodiment of FIG. 1A.
FIG. 1C illustrates a front isometric view of the embodiment of FIG. 1A, with certain portions removed for clarity.

In existing designs, pipes or hoses are typically used to convey the dielectric coolant within a chassis of, for example, a server. In some cases, there is a manifold that splits into 12 different hoses that feed coolant to: CPUs, GPUs, power supplies, RAM (DIMMs), M.2 memory, etc. It has been found that these pipes or hoses have a number of disadvantages, for example, they can: be complicated to route, for instance around components; take up a lot of space; make electronic components hard to access during maintenance, be difficult to fit and replace; and kink (reducing flow rate). An alternative to such pipes or hoses is therefore desirable.

It has been recognised that a circuit board or equivalently, printed circuit board (PCB) can be adapted to form part of a dielectric coolant distribution manifold. A gap or void can be created between the PCB and another part, for example part of the chassis or a gear tray, which can more generally be termed a substrate. This gap or void can be sealed, for instance with a gasket and filled with dielectric coolant. This gasket can be a flat cut gasket, over mould or poured seal, for example. It can be held in place with screws (fixings) or glued (bonded). If the base of the chassis is used instead of the gear tray, less vertical height is needed. Holes can be designed into the PCB to distribute and/or direct dielectric coolant to the electronic components and/or associated heat sinks.

In existing designs, the space under a PCB is often free space. This is because 3 to 5 mm of clearance behind a PCB is typically desirable to clear all the legs on the electronic components and prevent them from coming into electrical contact with a gear tray or chassis underneath. Gear trays are often used to allow different IT configurations in the same chassis. The complex fixings and mounting points are on the gear tray rather than on the chassis.

A manifold according to the disclosure has significant advantages. In some layouts, about 75% of the hoses and pipes are no longer required, removing the disadvantages associated therewith. Cost can also be significantly reduced, as the numbers of manifolds, hoses, hose fittings and nozzles can be reduced. Assembly can also be significantly quicker, reducing cost further. A significant reduction is space requirements is also provided, as existing dielectric coolant manifolds, which usually sit between the PCB and the plate heat exchanger, can be long. As components get hotter and higher flow rate of dielectric coolant is used to cool the system, the saved space can be used to provide additional and/or larger pumps. Quick release (hot swappable) pumps may also be used in the space provided. Also, the additional space may be used for the general dielectric coolant in the base of the chassis to return back to the pumps. More densely-packed component design may create stagnant areas and issues with pump priming, which a manifold according to the disclosure can help to address.

In general terms, there may be considered a manifold for distribution of dielectric coolant within a chassis to allow the dielectric coolant to receive heat from at least one electronic component mounted within the chassis. The manifold comprises: a circuit board, having first and second opposing surfaces; and a substrate, at least partially spaced apart from the circuit board and a gap between a first surface of the circuit board and the substrate being configured to receive and contain (and particularly accumulate) dielectric coolant. Advantageously, one or more apertures are provided in the circuit board to allow dielectric coolant contained in the gap to flow across the opposing surfaces of the circuit board (or substrate). As will be discussed below, an aperture or apertures may be provided in the substrate in some embodiments (for example for a shower). Typically, the at least one electronic component is mounted on or above the second surface of the circuit board.

A first aperture or first set of apertures may be arranged to provide dielectric coolant to a first electronic component or first electronic component arrangement having a first heat output in operation. Then, a second aperture or second set of apertures may be arranged to provide dielectric coolant to a second electronic component or second electronic component arrangement having a second heat output in operation, the second heat output being greater than the first heat output. In that case, a size of the second aperture or second set of apertures is typically larger than a size of the first aperture or first set of apertures (for example, the ratio of sizes being proportional to the ratio of heat outputs).

Advantages will be further discussed with reference to a number of specific embodiments, which will be discussed below. Although these embodiments discuss the combination of a manifold in accordance with the disclosure used with specific electronic component (and associated cooling) configurations, it will be understood that different designs and combinations of electronic component (and associated cooling) configurations can be considered, in particular based on those described herein.

A first embodiment concerns high density Hard Disk Drive (HDD) or Solid State Drive (SSD) arrays (also termed a JBOD). These are often vertically orientated for ease of "hot swap". Co-pending UK Patent Application Number 200187.2 describes a housing of multiple heat generating components, in particular IT components such as HDDs, which allows the components to fit within the housing with adaptations such that a set, minimal amount of evenly-distributed liquid coolant can flow around each component or components to give even (and preferably, optimum) cooling. Each housing may hold a set number of heat generating components, each of which typically has its own bay, for example at least partly formed by side walls of the housing, although some bays could hold multiple components.

Within each housing exists a (small) integrated through-manifold or manifolds which allow coolant to be fed to each bay (in parallel) respectively. Each manifold has multiple outlets which allows it to feed specific bays (that is, one or more manifold outlets, or equivalently bay inlets, per bay). For example, small holes may be provided to the base of the bay. Liquid coolant accumulates in each bay around the heat generating components, cooling it thereby. The bays may all be the same or they may be different. A PCB or other type of circuit board advantageously provides the base for the housing, as well as connections for the IT mounted within it. The base PCB is advantageously sealed to the side walls, to allow accumulation of coolant in the bays.

The integrated manifold is advantageously located at the bottom of the housing, allowing coolant to be fed from the bottom rising upward and evenly around the heat generating component in the bay. This may comprise integrated coolant pipes (channels) between each cooling bay. Each bay may have four sides (defined by the side walls). This may be formed from one front side wall, one back side wall and two larger side walls together creating an isolated bay, for instance having a generally cuboid shape. The position of these walls beneficially dictates the amount of liquid coolant forming a layer around the heat generating component, which is desirable to minimise the coolant amount and/or calibrate (or optimise) the flow rate of the liquid coolant. Thus, the dielectric coolant is fed through conduits (pipes) housed in the bay walls. This takes up space and limits how densely the hard drives can be populated.

According to the present disclosure, an improvement to this housing is provided. Referring to FIG. 1A, there is depicted a plan view of a full chassis assembly according to this embodiment. This comprises: a chassis 4; a pump 1; a pump-to-heat exchanger pipe or hose 2; a plate heat exchanger 3; a heat exchanger-to-manifold pipe or hose 5; a manifold PCB base 6; a HDD support structure 7; a plurality of HDDs 8; vertically-mounted PCB structures (for instance, having a CPU mounted thereupon) 9; a secondary coolant outlet 10; and a secondary coolant inlet 11. The chassis assembly may be stored in a rack (not shown) and located in a facility, for instance a server farm building. The manifold PCB base 6 is horizontally oriented ("horizontal" in the context of the present disclosure meaning generally parallel with the largest elongate side of the cuboid-shaped chassis 4, typically proximate the substrate, and "vertical" meaning perpendicular to this plane). The HDD support structure 7 forms bays in which the HDDs 8 are located. In this design, each bay holds one HDD 8.

Referring to FIG. 1B, there is shown a rear isometric view of the embodiment of FIG. 1A and referring to FIG. 1C, there is illustrated a front isometric view of the embodiment of FIG. 1A, with support structure 7; HDDs 8 and vertically-mounted PCBs 9 removed for clarity. The upper part of the manifold structure, formed by the manifold PCB base 6 and the HDD support structure 7 can be seen. The chassis 4 holds dielectric coolant in its base, which is drawn up by the pump 1 and provided to the heat exchanger 3. The heat exchanger 3 cools the dielectric coolant by transferring heat to a secondary liquid coolant (typically water based) provided from the facility in which the chassis assembly is located. The secondary liquid coolant is provided to the heat exchanger 3 through the secondary coolant inlet 11 and the heated secondary liquid coolant then exits the chassis assembly through the secondary coolant outlet 10.

Figures 2, 3:
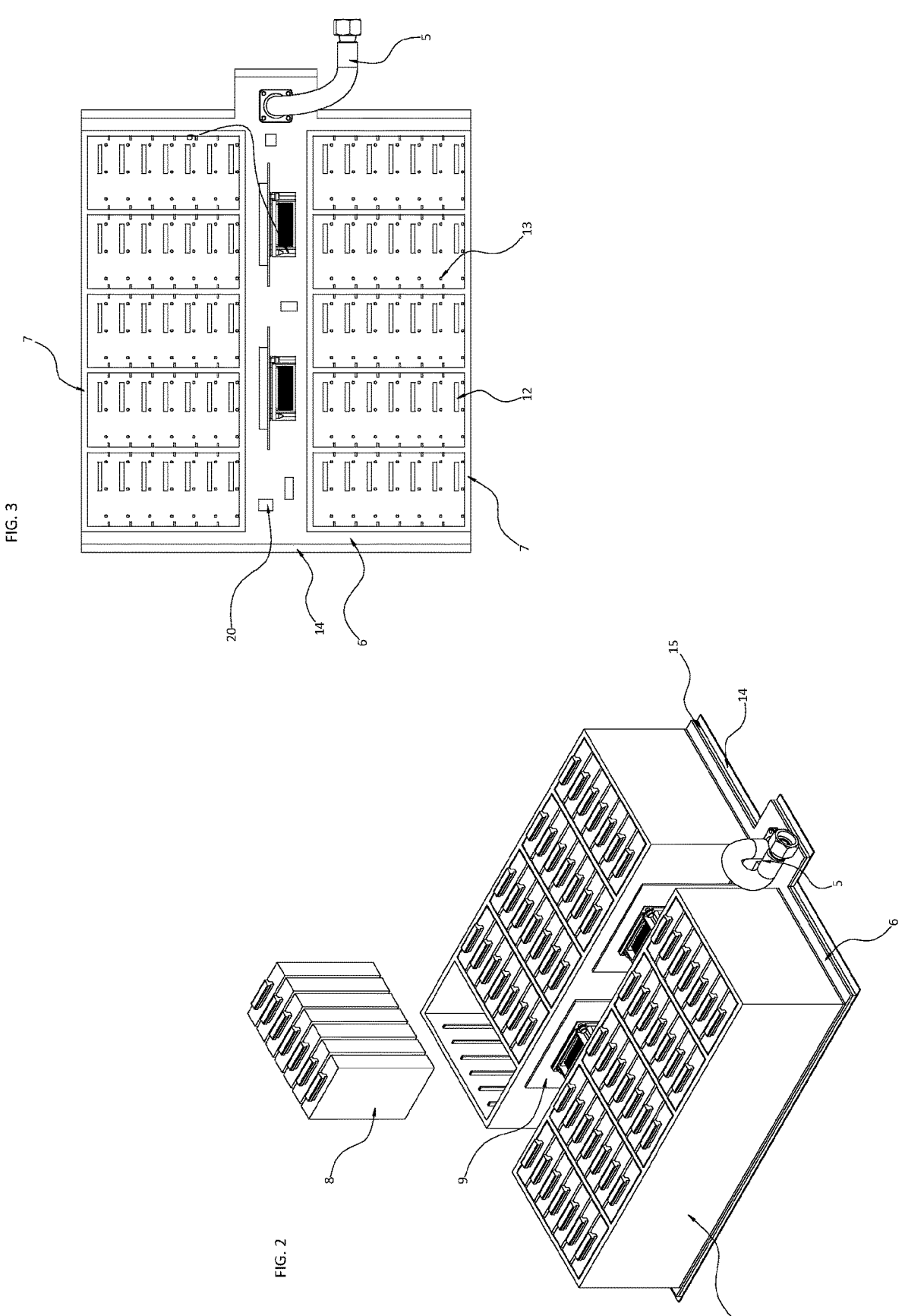
FIG. 2 shows a rear isometric partially-exploded view of a manifold assembly part of the embodiment of FIG. 1A.
FIG. 3 illustrates a plan view of the manifold assembly part of FIG. 2, with certain portions removed for clarity.

Referring next to FIG. 2, there is shown a rear isometric partially-exploded view of a manifold assembly part of the chassis assembly. Some of the HDDs 8 are removed to show how they fit into the support structure 7. Also shown are: a gear tray 14, which sits beneath the manifold PCB base 6; and a PCB manifold sealing gasket 15. With reference to FIG. 3, there is illustrated a plan view of the manifold assembly part of FIG. 2, with the HDDs 8 removed for clarity. Also shown are: HDD connectors 12, which are provided on the manifold PCB base 6; and cooling apertures 13. The HDDs 8 are mounted in the bays formed by the HDD support structure 7 and electrical connections to each HDD 8 are provided by a respective HDD connector 12.

The gap between the manifold PCB base 6 and the gear tray 14 provides a manifold structure within which dielectric coolant can accumulate (a manifold cavity). This gap is typically used for electrical component clearance and thereby effectively takes up zero space (or very minimal space) that is otherwise unused. The dielectric coolant is provided to this gap via the heat exchanger-to-manifold pipe or hose 5. The accumulated dielectric coolant is then provided into the HDD bays formed by the support structure 7 through the cooling apertures 13. It can be seen that each bay has multiple cooling apertures 13. Each of the cooling apertures 13 is relatively small (typically less than 1%, 2%, 3%, 4% or 5% of the base surface area of the bay). In operation, the dielectric coolant accumulates in the bay at least partially (and typically fully) submerging the HDD 8 housed in the bay and overflowing the bay walls and the outer walls of the HDD support structure 7, thereby collecting with the remaining coolant on the manifold PCB base 6 and in the base of the chassis 4, from where it can be caused to flow due to the pump 1.

Figure 4B:
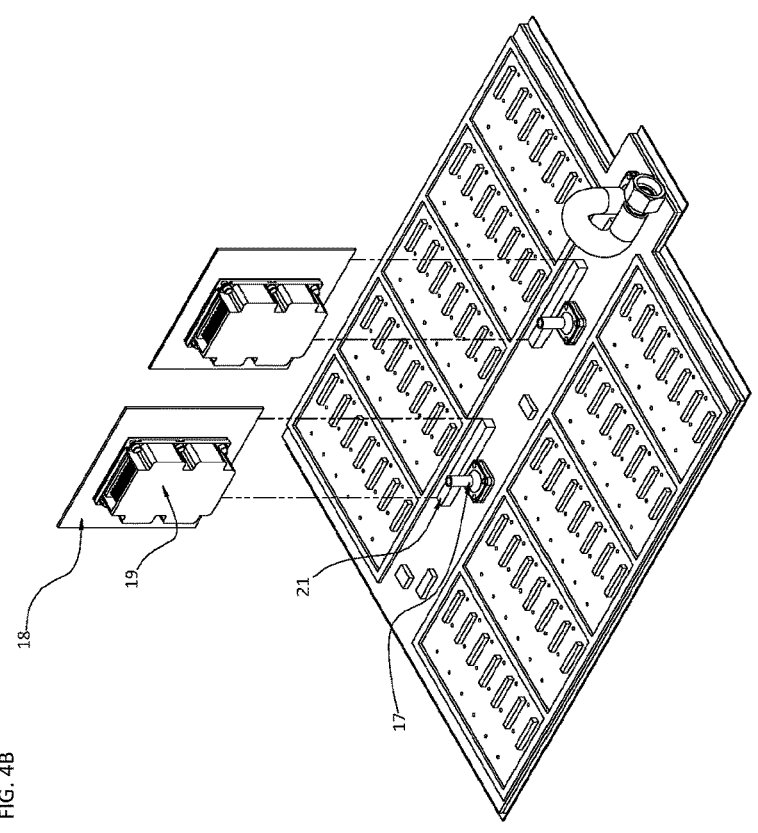
FIG. 4B shows a partially exploded version of FIG. 4A.
Figure 4A:
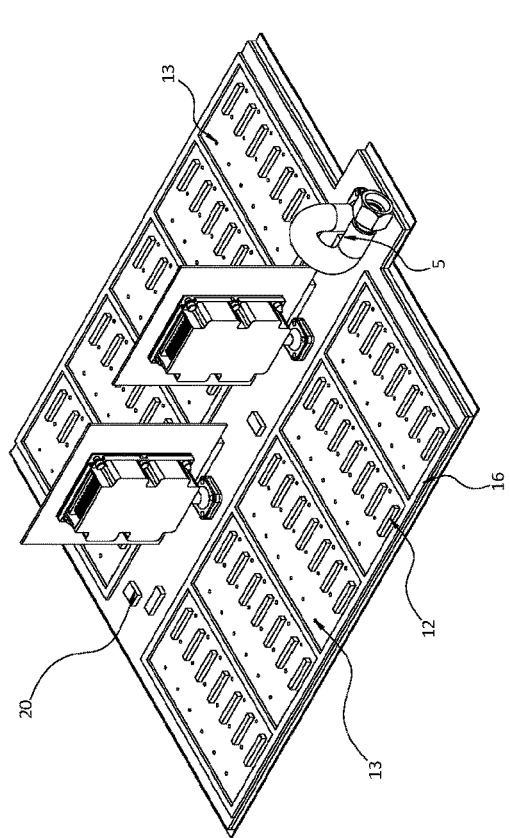
FIG. 4A depicts a rear isometric view of circuit board portions of the embodiment of FIG. 1A.

Referring next to FIG. 4A, there is depicted a rear isometric view of circuit board portions of the chassis assembly, particularly the manifold PCB base 6 (with the gear tray 14 and the PCB manifold sealing gasket 15 beneath) and the vertically-mounted PCB structures 9. Also shown in this drawing are: HDD bay sealing gasket 16, which seals the outer walls of the HDD support structure 7 to the manifold PCB base 6; and lower temperature electronic component 20, which is cooled by the coolant that collects on the manifold PCB base 6, having overflowed the outer walls of the HDD support structure 7.

Now, reference is made to FIG. 4B, in which there is shown a partially exploded version of FIG. 4A, more clearly showing: a vertical cooling nozzle 17; a vertical PCB (for instance having a CPU mounted thereupon) 18; a vertically-oriented heat sink 19; and vertical PCB electrical connectors 21, which are provided on the on the manifold PCB base 6. A further aperture (not shown in this drawing) allows dielectric coolant from the gap between the manifold PCB base 6 and the gear tray 14 to be provided to the vertical cooling nozzle 17. The vertical cooling nozzle 17 provides the dielectric coolant to the heat sink 19. The details of this heat sink may be found in International Patent publication WO-2019/048864 (at least with reference to FIGS. 22 to 28 and accompanying description), the details of which are incorporated herein by reference.

Figures 5A, 5B:
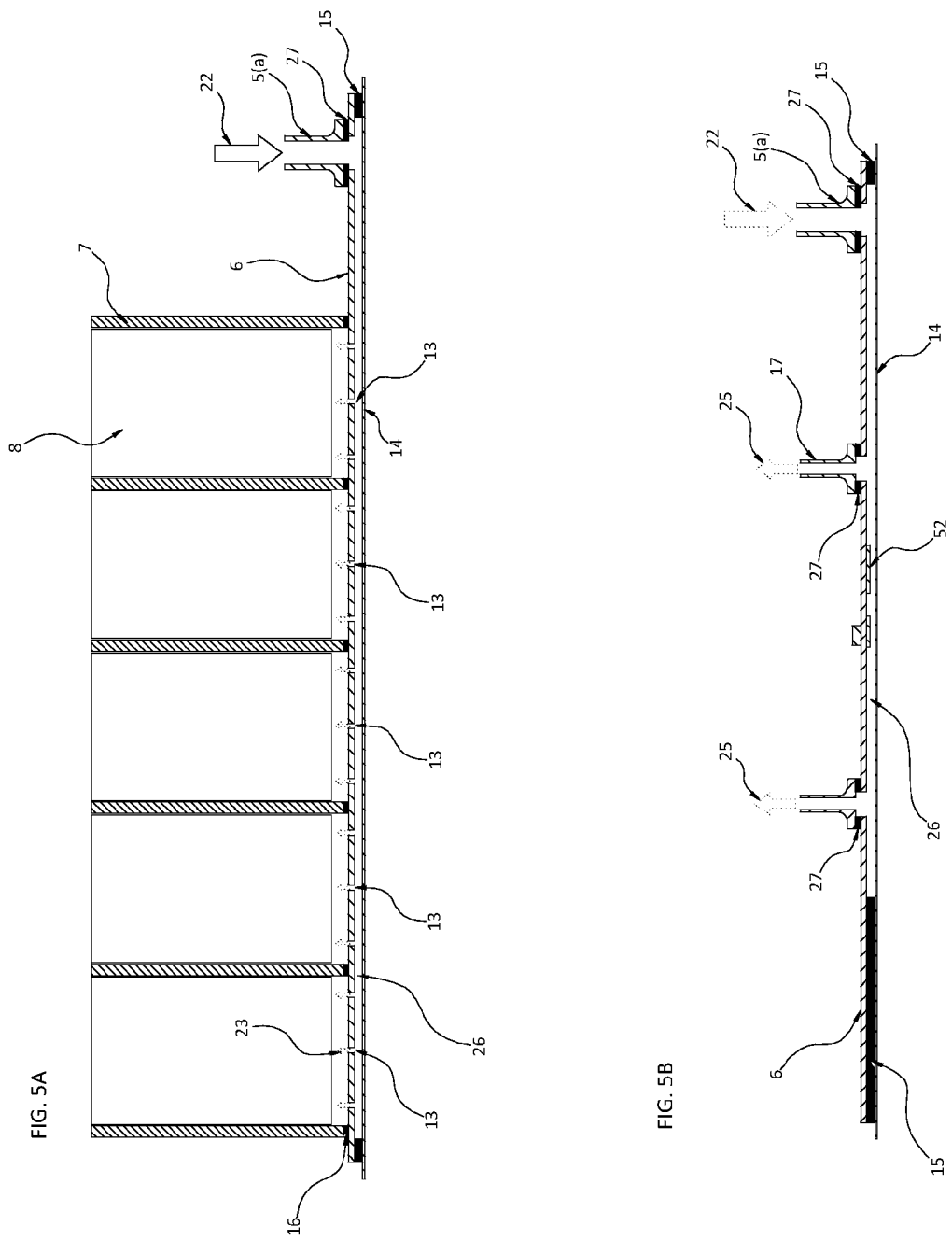
FIG. 5A illustrates a first cross-sectional view of a manifold part of the embodiment of FIG. 1A, showing a flow of dielectric coolant.
FIG. 5B depicts a second cross-sectional view of the manifold part of the embodiment of FIG. 1A, showing a flow of dielectric coolant.

Now referring to FIG. 5A, there is illustrated a first cross-sectional view of a manifold part of the embodiment of FIG. 1A, showing a flow of dielectric coolant to within the HDD support structure 7. Further shown in this drawing are: a PCB manifold inlet nozzle 5(*a*); a nozzle gasket 27; and a dielectric nozzle inlet hole 28. This drawing shows the flow of dielectric coolant from inlet dielectric flow 22 through dielectric nozzle inlet hole 28 and PCB manifold inlet nozzle 5(*a*), via accumulated dielectric coolant flow 26 within the gap, to horizontal outlet dielectric flow 23 via the cooling apertures 13.

Referring to FIG. 5B, there is depicted a second cross-sectional view of the manifold part of the embodiment of FIG. 1A, showing a flow of dielectric coolant to the vertically-mounted PCB structures 9. Shown in this drawing is nozzle cooling aperture 29, which is similar to cooling apertures 13, but larger in size and provided to allow flow of dielectric coolant to the vertical cooling nozzle 17. This drawing further shows the flow of dielectric coolant from inlet dielectric flow 22 via PCB manifold inlet nozzle 5(*a*), via accumulated dielectric coolant flow 26 within the gap, to vertical PCB outlet dielectric flow 25 via the nozzle cooling aperture 29 and vertical cooling nozzle 17. Also shown is underside-mounted component 52. This is mounted on the underside of the manifold PCB base 6 (within the gap) and is cooled by the accumulated dielectric coolant flow 26 within the gap. The void between the manifold PCB base 6 and the gear tray 14 could be increased by using a thicker PCB manifold sealing gasket 15.

Multiple housings may be provided and beneficially coupled together, for example in parallel. For example, part of the manifold may provide an opening to couple with the manifold and/or coolant inlet of other housings. In that case, the opening (and/or other parts of the manifold) may be sealed for some housings, so as to prevent coolant passing through the sealed parts of the manifold (for instance, to provide an end point for the coupled housings).

Figure 6:
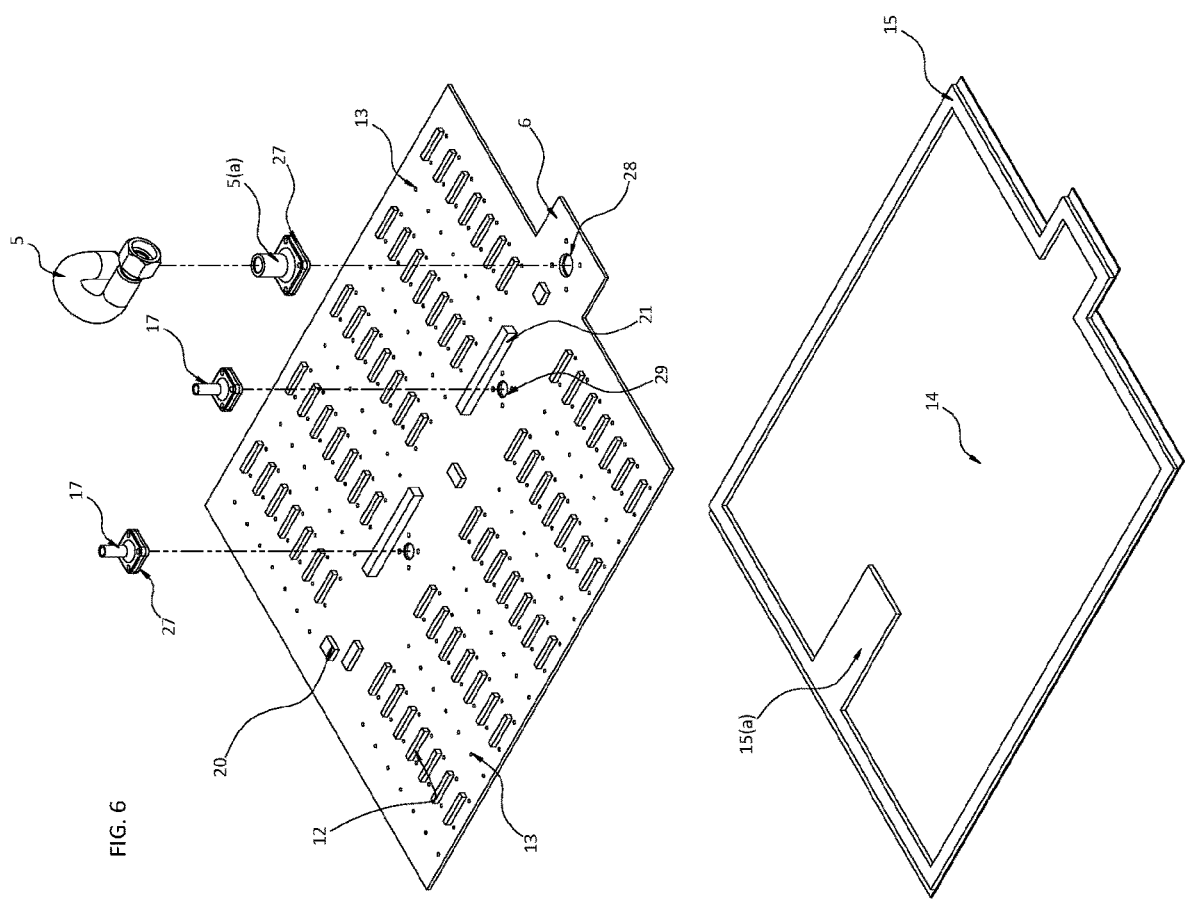
FIG. 6 shows a rear isometric exploded view of the manifold part of the embodiment of FIG. 1A.

Referring to FIG. 6, there is shown a rear isometric exploded view of the manifold part. The assembly and construction of the manifold part can thereby be clearly seen. Cooling pipes (channels) that are integrated into the cooling bays are no longer needed. This saves significant space. As a consequence of this design, more HDDs 8 can be fitted into the same space (increased density). Moreover, the overall complexity of the design, and therefore the reliability and cost, is significantly reduced.

Returning to the general terms discussed above, further optional and/or advantageous features may be considered. For example, the manifold may further comprise one or more electrical interfaces, each of the one or more electrical interfaces being mounted on the circuit board so as to receive a respective electronic component.

One or more fluid connectors (for example, nozzles) may each be arranged on (or above) the second surface of the circuit board to receive dielectric coolant from a respective at least one aperture of the one or more apertures. A coupling may be made to each fluid connector to direct dielectric coolant from the respective fluid connector to another part.

In some embodiments, the manifold may further comprise a support structure, mounted on or to the circuit board to provide one or more support structure volumes (for example, bays). Each support structure volume may be configured for a respective one or more electronic components (for instance, a disk drive or data storage component) of the at least one electronic component to be mounted within. The support structure beneficially cooperates with the circuit board such that dielectric coolant received via the one or more apertures accumulates within the one or more support structure volumes. Dielectric coolant received via the one or more apertures advantageously accumulates within the at least one support structure volume and overflows the at least one support structure volume. Each of the one or more electrical interfaces may be mounted on the circuit board with reference to a respective support structure volume so as to receive the one or more electronic components to be mounted within the support structure volume. For instance, this may allow a respective electronic component (for example a disk drive or data storage component) to sit in a respective support structure volume. More than one of the apertures may to open into at least one (or more than one or even all) of the support structure volumes.

In some embodiments, one or more electronic components may be an electronic component mounted on the second surface of the circuit board or on a further circuit board (which may be coupled to the second surface of the circuit board). Then, a receptacle structure, defining an internal receptacle volume, may be mounted adjacent the electronic component (for example adjoining, coupled to or integrated with a surface of the electronic component). Then, a receptacle conduit may provide dielectric coolant from at least one aperture of the one or more apertures to the internal receptacle volume, such that the dielectric coolant accumulates in the internal receptacle volume, for receiving heat from the electronic component. Advantageously, the internal receptacle volume is configured such that accumulated dielectric coolant overflows the internal receptacle volume.

In some embodiments, the electronic component is mounted perpendicular to the second surface of the circuit board (in terms of respective axes of elongation, for instance). Then, the internal receptacle volume of the receptacle structure may be arranged to receive heat from a surface of the electronic component (for instance, a surface perpendicular the second surface of the circuit board). In embodiments, a portion of the internal receptacle volume proximate the electronic component may defined by a wall part of the receptacle structure and/or the surface of the electronic component.

The manifold may further comprise a coolant inlet, arranged to receive a conduit carrying the dielectric coolant and transfer the dielectric coolant to the gap. The coolant inlet may be mounted on (or coupled to) a respective hole in the circuit board or the substrate, to allow dielectric coolant to flow from the fluid connector to the gap. The hole is larger than at least one, some or all of the one or more apertures. The coolant inlet is optionally provided on a second surface side of the circuit board.

At least one gasket may be arranged to seal between the first surface of the circuit board and the substrate and at least partially define the gap thereby.

In another aspect, there may be provided a cooling module, comprising: a chassis, defining a chassis internal volume; a plurality of electronic components mounted in the chassis internal volume; and a manifold for distribution of dielectric coolant as herein disclosed (within the chassis internal volume), the manifold being configured to receive dielectric coolant and direct the received dielectric coolant for cooling at least one of the plurality of electronic components. Advantageously, there is further provided a heat exchanger (preferably within the chassis and/or chassis internal volume), arranged to receive dielectric coolant, transfer heat from the received dielectric coolant to a heat sink and direct the dielectric coolant to the manifold. The heat sink typically comprises a secondary liquid coolant (for example, water-based), received at the heat exchanger from outside the cooling module. The chassis internal volume typically comprises a base (for example, the largest or one of the largest sides, typically proximate or forming the substrate), the circuit board of the manifold being oriented parallel to the base. The dielectric coolant and secondary liquid coolant are beneficially maintained in liquid phase during operation.

Optionally, a pump (or pumps) may be arranged to cause the dielectric coolant to flow from the heat exchanger to the manifold. The pump (or pumps) may be upstream from the manifold. Multiple pumps may work in series or and/or provide redundancy.

The manifold is beneficially configured for dielectric coolant to flow out and accumulate in (a base of) the chassis internal volume. The level of coolant accumulated in the base is preferably lower than a height of the support structure volume and/or internal receptacle volume.

Further details will be described in general details below. Further specific embodiments are first disclosed.

Figures 7A, 7B, 7C:
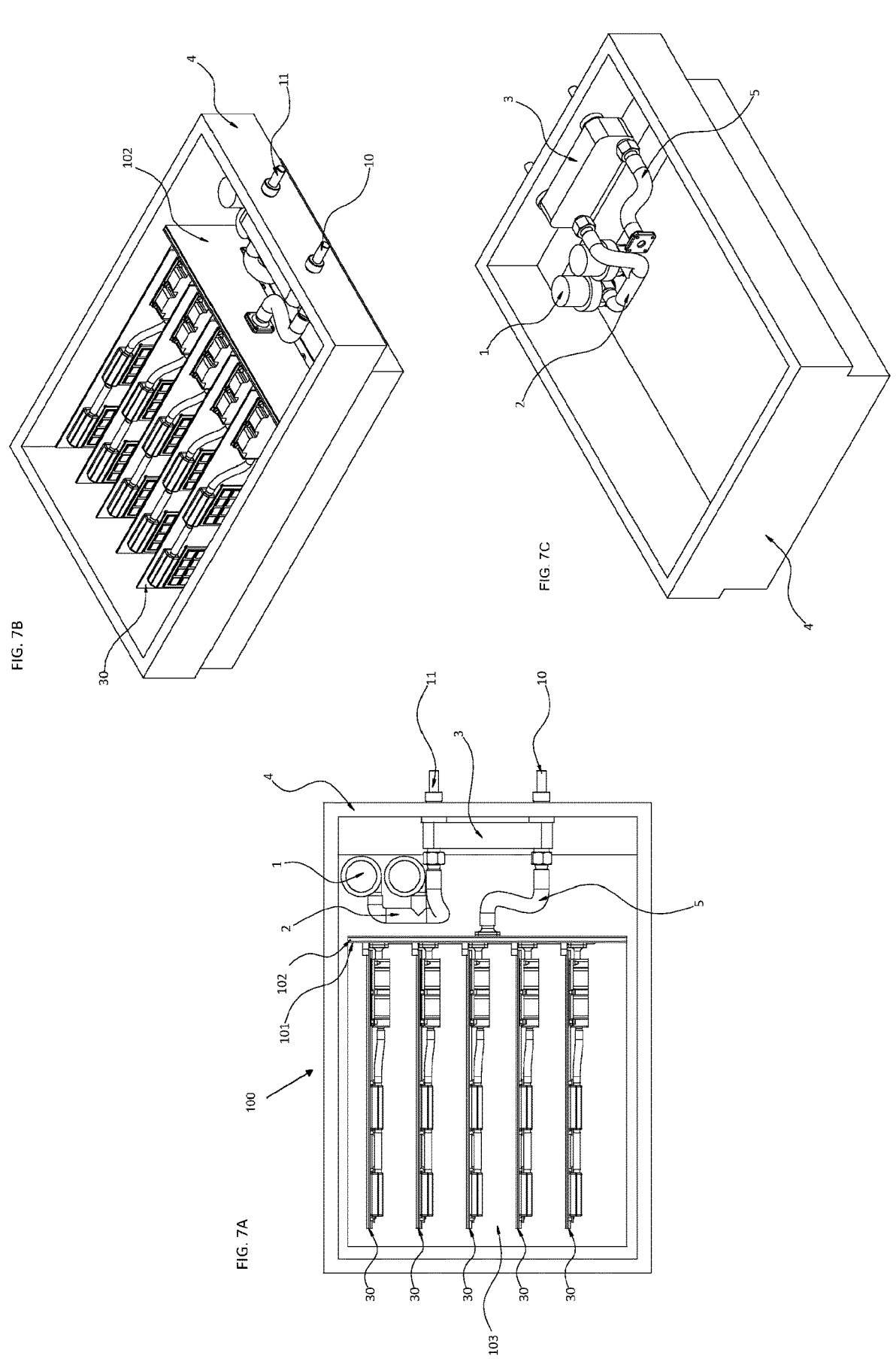
FIG. 7A depicts a plan view of a full chassis assembly according to a second embodiment.
FIG. 7B shows a rear isometric view of the embodiment of FIG. 7A.
FIG. 7C illustrates a front isometric view of the embodiment of FIG. 7A, with certain portions removed for clarity.

A second embodiment is now discussed, in which multiple vertically-oriented PCBs are provided, each with respective electronic components thereon. With reference to FIG. 7A, there is depicted a plan view of a full chassis assembly according to this second embodiment and referring to FIG. 7B, there is shown a rear isometric view of the embodiment of FIG. 7A. Some of the features are the same as for the first embodiment and these are, in particular, shown with the same reference numerals. For the sake of conciseness, these features will not be discussed again in depth and can be understood with reference to the other embodiments as herein disclosed.

In contrast to the first embodiment, a manifold structure 100 of the second embodiment is vertically oriented (and shown more clearly in subsequent drawings). The full chassis assembly of this embodiment further provides: a manifold PCB base 101; a back-substrate 102; and a rail board 103. The manifold PCB base 101 is similar to the manifold PCB base 6 of the first embodiment and the back substrate 102 is similar to the gear tray 14 of the first embodiment. Together, they form a manifold with a gap between them providing a manifold cavity for dielectric coolant to accumulate within. Also shown are vertical boards 30 (for instance motherboards, each comprising a CPU and other electronic components). The rail board 103 provides a structural support for the vertical boards 30. In practice, a gear tray is folded at 90 degrees to make a bracket formed by the back-substrate 102 and the rail board 103.

Referring to FIG. 7C, there is illustrated a front isometric view of the second embodiment, with the manifold structure

100 and the vertical boards 30 removed for clarity. It can thereby be seen that the chassis 4, the pump 1, the pump-to-heat exchanger pipe or hose 2, the plate heat exchanger 3 and the heat exchanger-to-manifold pipe or hose 5 are all configured in essentially the same way as the first embodiment. It will be recognised that this can be changed in all embodiments, for example to place the pump 1 differently for more efficient flow of dielectric coolant, depending on the application.

Figure 8B:
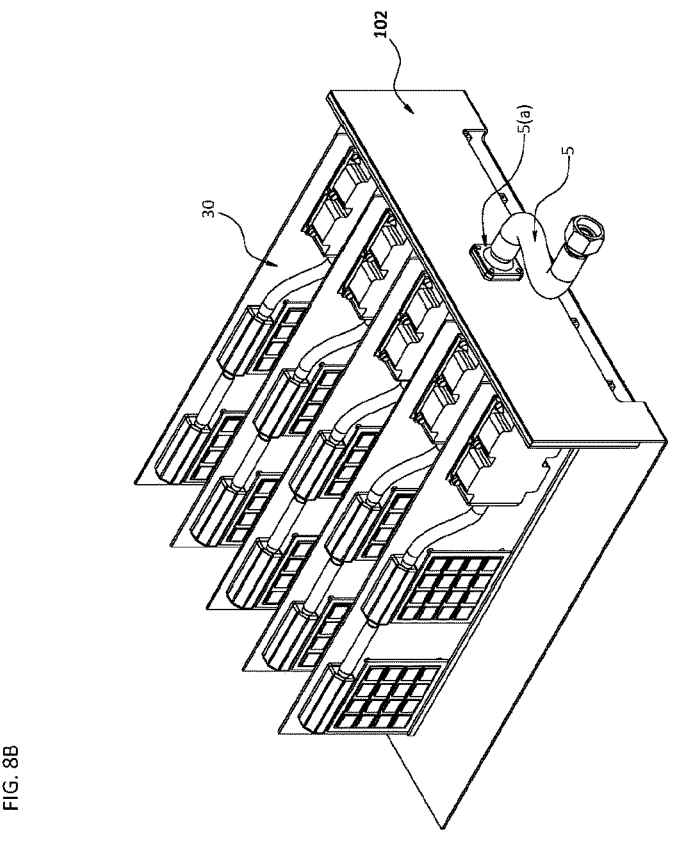
FIG. 8B depicts a rear isometric view of the manifold assembly of FIG. 8A.
Figure 8A:
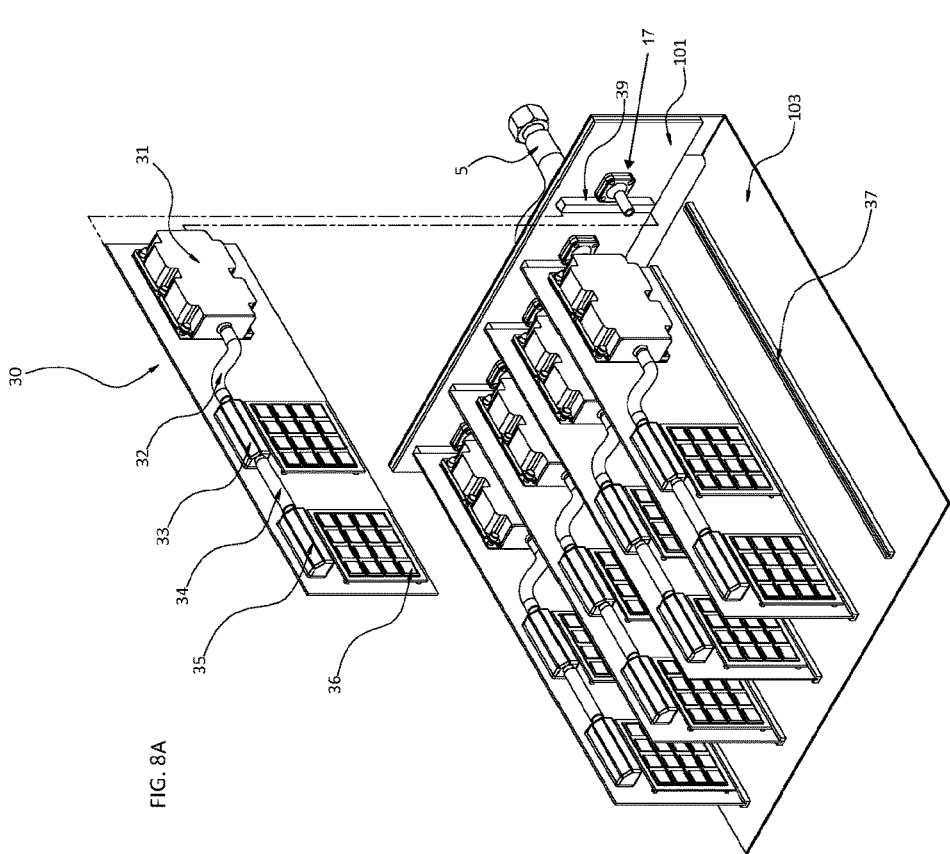
FIG. 8A shows a front isometric partially-exploded view of a manifold assembly part of the embodiment of FIG. 7A.

Next referring to FIG. 8A, there is shown a front isometric partially-exploded view of a manifold assembly part of the second embodiment, including the manifold structure 100; and the vertical boards 30, with one vertical board 30 removed. Additionally, a number of further parts can be seen, including: PCB rails 37 for structurally supporting the vertical boards 30; vertical cooling nozzle 17; and a vertical motherboard electrical connector 39. The vertical motherboards 30 each slot into a respective electrical connector 39 on the manifold PCB base 101 of the back plane manifold structure 100 horizontally rather than vertically.

In addition, further details of the vertical boards 30 are shown. Each vertical board 30 comprises: a vertical bath heat sink 31; a heat sink outlet hose or pipe 32; a PCB-mounted inline component shower 33; a joining hose or pipe 34; a PCB-mounted end component shower 35; and a vertical mezzanine PCB 36 (4×M.2 in this example). Referring to FIG. 8B, there is depicted a rear isometric view of the manifold assembly. Dielectric coolant is provided from the heat exchanger 3 to the manifold structure 100 through the heat exchanger-to-manifold pipe or hose 5 and the PCB manifold inlet nozzle 5(*a*). In this way, dielectric coolant can accumulate within the manifold cavity and provided through each of the vertical cooling nozzles 17 to a respective vertical boards 30. The PCB manifold inlet nozzle 5(*a*) is mounted to a rear face of the back-substrate 102, rather than the top face of a manifold PCB as in the first embodiment, but this does not make a significant difference in functionality.

The flow of dielectric coolant through the vertical board 30 is first to the vertical bath heat sink 31 (as discussed above), with coolant thereby accumulating within an internal volume of the vertical bath heat sink 31, before flowing out through heat sink outlet hose or pipe 32. The dielectric coolant flowing out then reaches the PCB-mounted inline component shower 33 and some dielectric coolant is showered on a first vertical mezzanine PCB 36. After showering the vertical mezzanine PCB 36, this dielectric coolant collects in the rail board 103 and the base of the chassis 4. Remaining dielectric coolant that has not been released by the PCB-mounted inline component shower 33 passes through the joining hose or pipe 34 to PCB-mounted end component shower 35. From this, the remaining dielectric coolant is showered on a second vertical mezzanine PCB 36 and again, collects in the rail board 103 and the base of the chassis 4.

The PCB-mounted inline component shower 33 and the PCB-mounted end component shower 35 use the vertical boards 30 as part of the shower head (in this case the back wall). The shower heads can be fixed to the vertical boards 30 with screws and a gasket, or could be bonded.

In general terms, there may be considered a coolant distribution component within a chassis to allow the dielectric coolant to receive heat from at least one electronic component mounted within the chassis. The component comprises: a circuit board, having first and second opposing surfaces; and a piping side (which may be considered a substrate), coupled to the circuit board with a gap between a first surface of the circuit board and the piping side being configured to receive and contain dielectric coolant. One or more apertures are provided in the piping side to allow dielectric coolant contained in the gap to distribute dielectric coolant (shower) components on the circuit board. This therefore may be understood as a separate aspect of the disclosure, which may be combined with any other aspect and/or feature disclosed herein.

Figure 9B:
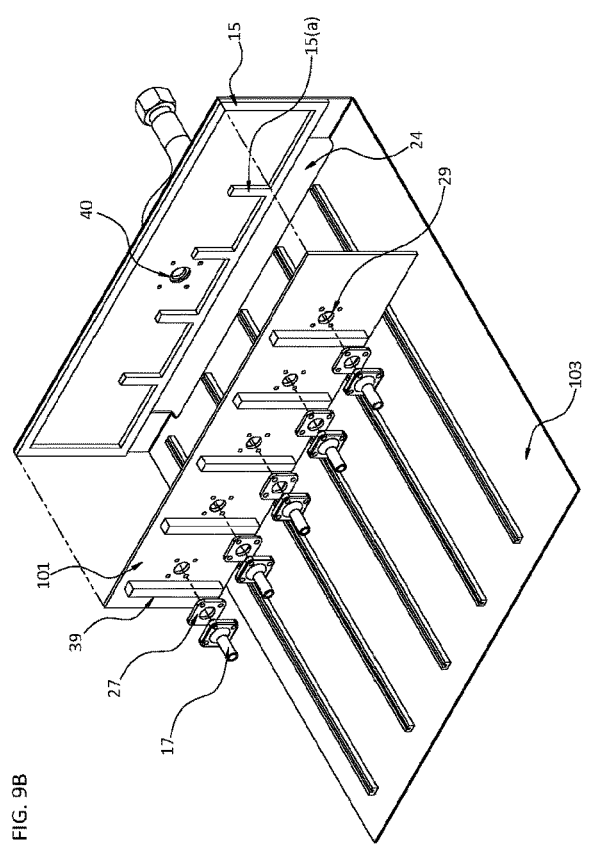
FIG. 9B shows an exploded view of FIG. 9A.
Figure 9A:
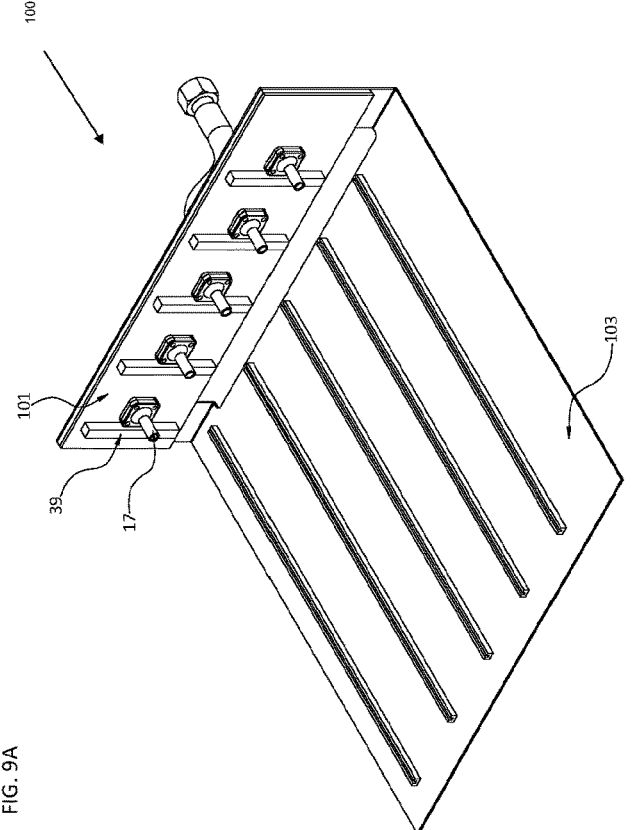
FIG. 9A illustrates a front isometric view of a manifold structure of the embodiment of FIG. 7A.

Referring to FIG. 9A, there is illustrated a front isometric view of the manifold structure 100, without the vertical boards 30. Reference is also made to FIG. 9B, which shows an exploded view of FIG. 9A. This further shows: nozzle gasket 27; dielectric nozzle inlet hole in the back-substrate 102; PCB manifold sealing gasket 15; and gasket extension 15(*a*). The gasket extension 15(*a*) is shaped to control flow rate and/or for flow balancing. Also visible in this drawing is an opening 24 in the back-substrate 102, between the back-substrate 102 and the rail board 103 (which in practice are typically an integrated component formed by a bent gear tray). This opening 24 allows better return of dielectric coolant from the rail board 103 to the pump 1.

Figure 10:
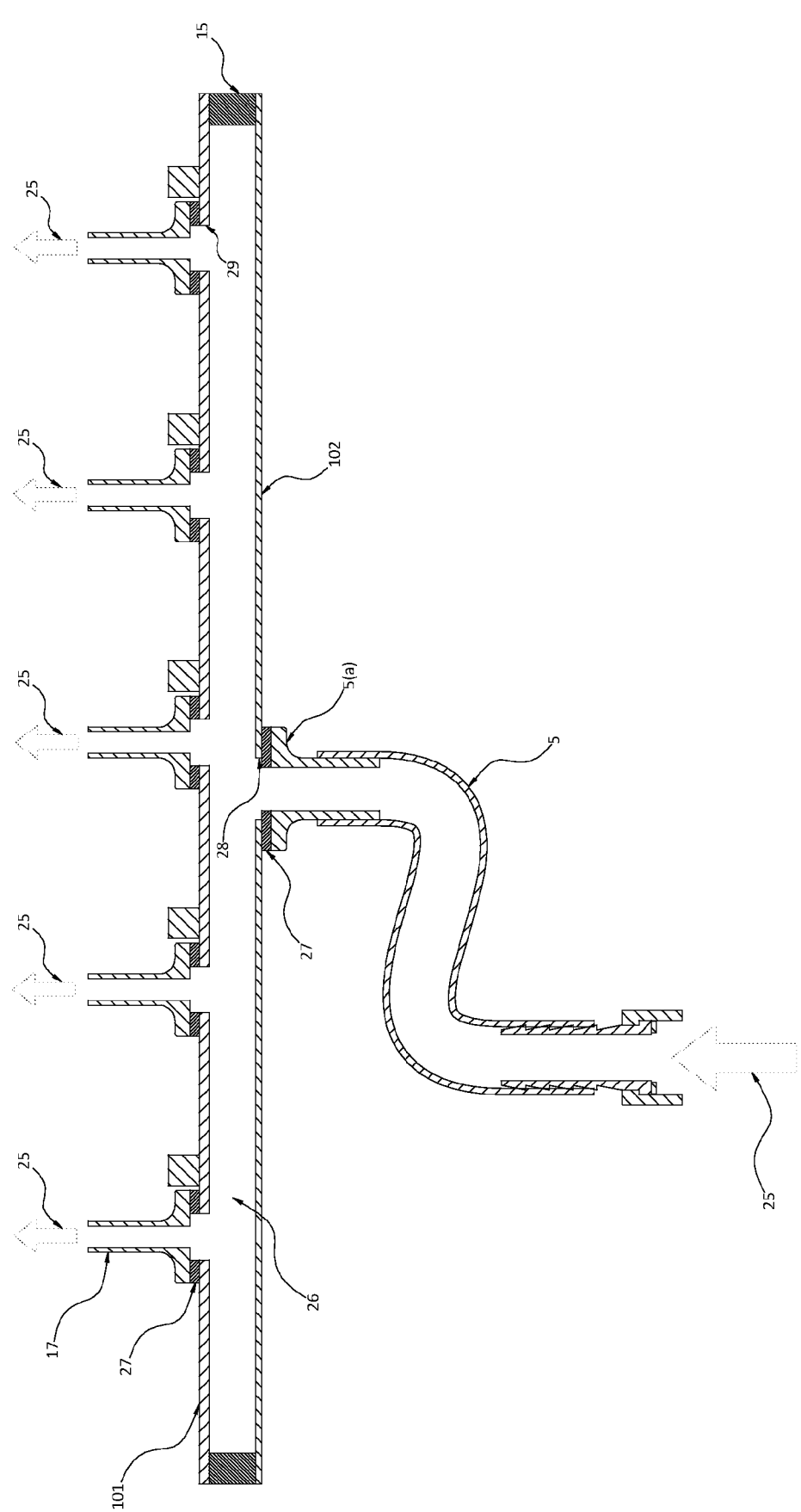
FIG. 10 illustrates a top-down cross-sectional view of the manifold part of FIG. 9A, showing a flow of dielectric coolant.

Reference is then made to FIG. 10, in which there is illustrated a top-down cross-sectional view of the manifold part. This drawing shows the flow of dielectric coolant from inlet dielectric flow 22 via PCB manifold inlet nozzle 5(*a*) and dielectric nozzle inlet hole 28, via accumulated dielectric coolant flow 26 within the gap, to vertical PCB outlet dielectric flow 25 via the nozzle cooling aperture 29 and vertical cooling nozzle 17.

Returning to the general terms discussed above, further optional and/or advantageous features may be considered. For example, in embodiments, the circuit board of the manifold and/or the substrate (or at least part of the substrate) may be oriented perpendicular to the base. The coolant inlet may be provided on the substrate.

In some embodiments, the electronic component is mounted perpendicular to the second surface of the circuit board (and also perpendicular to a base of the chassis). An internal receptacle volume of a receptacle structure (as discussed above) may then be arranged to receive heat from a surface of the electronic component (for instance, a surface perpendicular the second surface of the circuit board and the chassis base). Additionally or alternatively, a conduit may be provided from an aperture (or fluid connector) and/or receptacle structure with openings in the conduit to allow showering of one or more electrical components with dielectric coolant. The openings may be in a portion of the conduit proximate the base.

Figures 11A, 11B, 11C:
FIG. 11A depicts a plan view of a full chassis assembly according to a third embodiment.
FIG. 11B shows a rear isometric view of the embodiment of FIG. 11A.
FIG. 11C illustrates a front isometric view of the embodiment of FIG. 11A.

Now, a third embodiment is described, which is similar to the design shown in at least FIG. 1 of International Patent publication WO-2019/048864, but with adaptations according to the present disclosure. Referring now to FIG. 11A, there is depicted a plan view of a full chassis assembly according to the third embodiment. Reference is further made to: FIG. 11B, in which there is shows a rear isometric view of the embodiment of FIG. 11A; and FIG. 11C, in which there is illustrated a front isometric view of the embodiment of FIG. 11A. Some of the features are the same as for the first and second embodiments and these are, in particular, shown with the same reference numerals. For the sake of conciseness, these features will not be discussed again in detail and can be understood with reference to the other embodiments as herein disclosed.

It can be seen that the chassis 4, the pump 1, the pump-to-heat exchanger pipe or hose 2, the plate heat exchanger 3 and the heat exchanger-to-manifold pipe or hose 5 are all configured in essentially the same way as the first and second embodiments. It will also be recognised that this can be changed in all embodiments, as previously discussed. Similarly to the first embodiment, there is also provided a manifold PCB base 6, which is horizontally oriented.

Figure 12B:
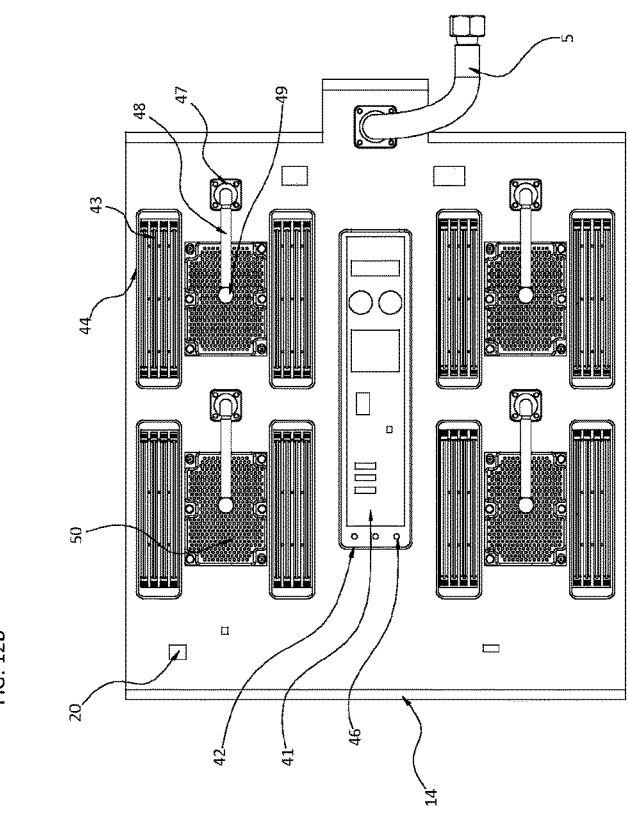
FIG. 12B illustrates a plan view of the manifold assembly part of FIG. 12A.
Figure 12C:
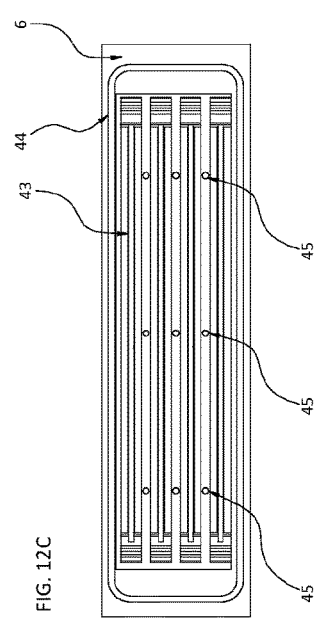
FIG. 12C depicts an enlarged portion of the plan view of FIG. 12B.
Figure 12A:
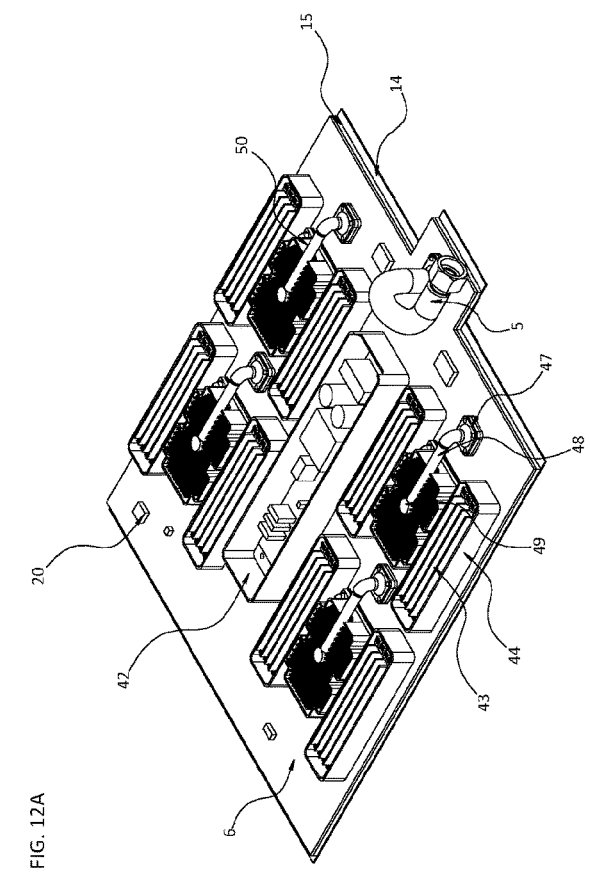
FIG. 12A shows a rear isometric view of a manifold assembly part of the embodiment of FIG. 11A.

Referring now to FIG. 12A, there is shown a rear isometric view of a manifold assembly part of this embodiment. Reference is also made to FIG. 12B, in which there is illustrated a plan view of the manifold assembly part of FIG. 12A. The manifold assembly part comprises: a power supply arrangement 41; a first horizontal bath heat sink structure 42; RAM DIMM boards 43; a second horizontal bath heat sink structure 44; dielectric coolant apertures 46; a horizontal heat sink inlet nozzle 47; a horizontal heat sink hose or pipe 48; a horizontal heat sink outlet nozzle 49; and a third horizontal heat sink 50.

As in previous embodiments, the gap between the manifold PCB base 6 and the gear tray 14 provides a manifold structure (cavity) within which dielectric coolant can accumulate. As in the first embodiment, this gap is typically used for electrical component clearance and thereby effectively takes up zero space (or very minimal space) that is otherwise unused. The dielectric coolant is provided to this gap via the heat exchanger-to-manifold pipe or hose 5.

The first horizontal bath heat sink structure 42 is similar to that disclosed in International Patent publication WO-2019/048864, specifically with reference to at least FIGS. 16 to 21, the details of which are incorporated herein by reference. Coolant is provided to the first horizontal bath heat sink structure 42, which surrounds the power supply arrangement 41, through first horizontal bath heat sink dielectric cooling apertures 46. The dielectric coolant rises up through the dielectric cooling apertures 46 and accumulates within a volume defined by sidewalls defined by the first horizontal bath heat sink structure 42. The dielectric coolant thereby cools the electronic components of the power supply arrangement 41 in the volume, before overflowing and collecting with the remaining coolant on the manifold PCB base 6 and in the base of the chassis 4, from where it can be caused to flow due to the pump 1.

The third horizontal heat sink 50 is similar to that disclosed in International Patent publication WO-2019/048864, specifically with reference to at least FIGS. 1 to 15, the details of which are incorporated herein by reference. The third horizontal heat sink 50 is mounted on an electronic component and defines an internal receptacle volume, which receives dielectric coolant via the horizontal heat sink inlet nozzle 47 and the horizontal heat sink hose or pipe 48. The horizontal heat sink outlet nozzle 49 at the end of the horizontal heat sink hose or pipe 48 directs coolant into the internal receptacle volume. The accumulated dielectric coolant in the internal receptacle volume thereby cools the electronic component on which the third horizontal heat sink 50 is mounted. The dielectric coolant overflows the third horizontal heat sink 50 and collects with the remaining coolant on the manifold PCB base 6 and in the base of the chassis 4, from where it can be caused to flow due to the pump 1.

The third horizontal heat sink 50 is cooled from the top, rather than the bottom in as in first horizontal bath heat sink structure 42. For the third horizontal heat sink 50, it is difficult to feed the dielectric coolant other than from the top or side. This therefore uses the horizontal heat sink inlet nozzle 47 (over a hole in the circuit board), the horizontal heat sink hose or pipe 48 and the horizontal heat sink outlet nozzle 49 to feed the coolant. The horizontal heat sink inlet nozzle 47 can be screwed in place with a gasket, bonded or over moulded, for example. However, the manifold PCB base 6 allows the horizontal heat sink hose or pipe 48 to be attached to the horizontal heat sink inlet nozzle 47 that is positioned adjacent and close to the third horizontal heat sink 50, thereby significantly reducing the amount of hose required and eliminating routing issues.

Also shown is lower temperature electronic component 20, which is cooled by the coolant that collects on the manifold PCB base 6, having overflowed the horizontal heat sinks.

Referring now to FIG. 12C, there is depicted an enlarged portion of the plan view of FIG. 12B, showing more detail of the RAM DIMM boards 43 and the second horizontal bath heat sink structure 44. This arrangement is similar to the first horizontal bath heat sink structure 42. RAM dielectric cooling apertures 45 in the manifold PCB base 6 allow dielectric coolant to accumulate accumulates within a volume defined by sidewalls defined by the third horizontal bath heat sink 50. The dielectric coolant thereby cools the RAM DIMM boards 43 in the volume, before overflowing and collecting with the remaining coolant on the manifold PCB base 6 and in the base of the chassis 4, from where it can be caused to flow due to the pump 1.

As there is very little space between the RAM DIMM boards 43, a nozzle and hose that will deliver the coolant into the small gaps, for example in the form of a shower that drips coolant on to the RAM DIMM boards 43, is difficult to achieve. The approach taken in the present disclosure obviates this issue by using small holes through the circuit board. Nothing needs to be removed to access the RAM DIMM boards 43.

It can therefore be seen that the coolant to the first horizontal bath heat sink structure 42 and the second horizontal bath heat sink structure 44 is fed directly through the apertures 45 and 46 in the manifold PCB base 6 into the base of the respective bath heat sink structures. This helps the coolant pass all of the heat emitting electrical components as it travels from the base to the top of the bath tub. Additionally, the holes in the manifold PCB base 6 can be positioned exactly where they are required. The RAM dielectric cooling apertures 45 are positioned in-between each RAM slot, in particular in a regular fashion.

Figure 13A:
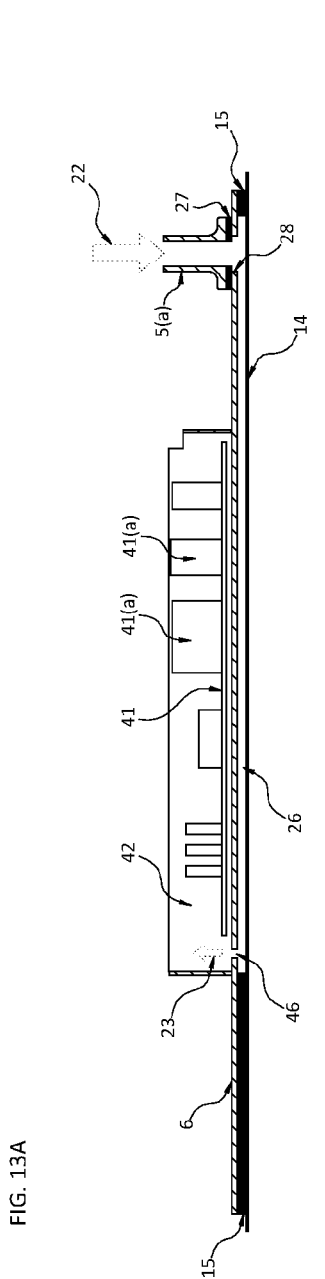
FIG. 13A illustrates a first side cross-sectional view of the manifold assembly part of FIG. 12A, showing a flow of dielectric coolant.

Referring next to FIG. 13A, there is illustrates a first side cross-sectional view of the manifold assembly part of this embodiment, showing a flow of dielectric coolant to the first horizontal bath heat sink structure 42. This drawing shows the flow of dielectric coolant from inlet dielectric flow 22 via PCB manifold inlet nozzle 5(*a*) and dielectric nozzle inlet hole 28, via accumulated dielectric coolant flow 26 within the gap, to horizontal outlet dielectric flow 23 via the dielectric cooling apertures 46. Also shown in this drawing are power supply components 41(*a*) of the power supply arrangement 41.

Figure 13B:
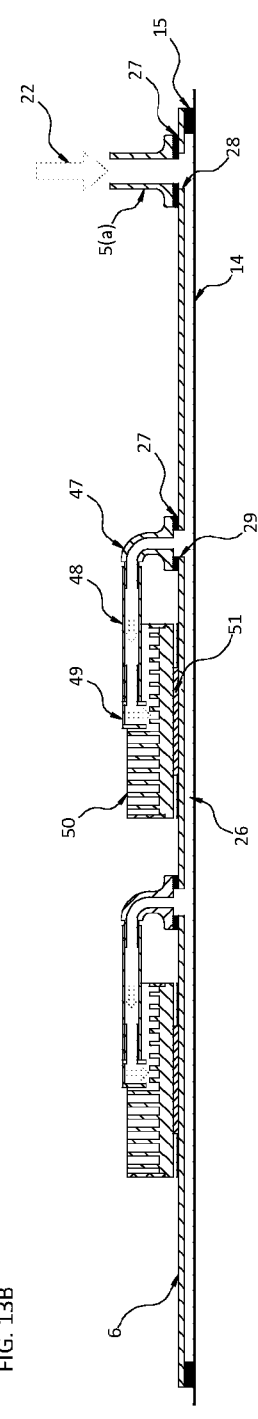
FIG. 13B shows a second side cross-sectional view of the manifold assembly part of FIG. 12A, showing a flow of dielectric coolant.

Now referring to FIG. 13B, there is shown a second side cross-sectional view of the manifold assembly part of this embodiment, showing a flow of dielectric coolant to the third horizontal heat sink 50. As shown here, multiple third horizontal heat sinks 50 are provided in this embodiment. This drawing shows the flow of dielectric coolant from inlet dielectric flow 22 via PCB manifold inlet nozzle 5(*a*) and dielectric nozzle inlet hole 28, via accumulated dielectric coolant flow 26 within the gap, to nozzle cooling aperture 29. The dielectric coolant then flows through horizontal heat sink inlet nozzle 47, the horizontal heat sink hose or pipe 48 and the horizontal heat sink outlet nozzle 49, as discussed above. A high temperature electronic component being cooled by the third horizontal heat sink 50 is also shown in this drawing.

Figure 14B:
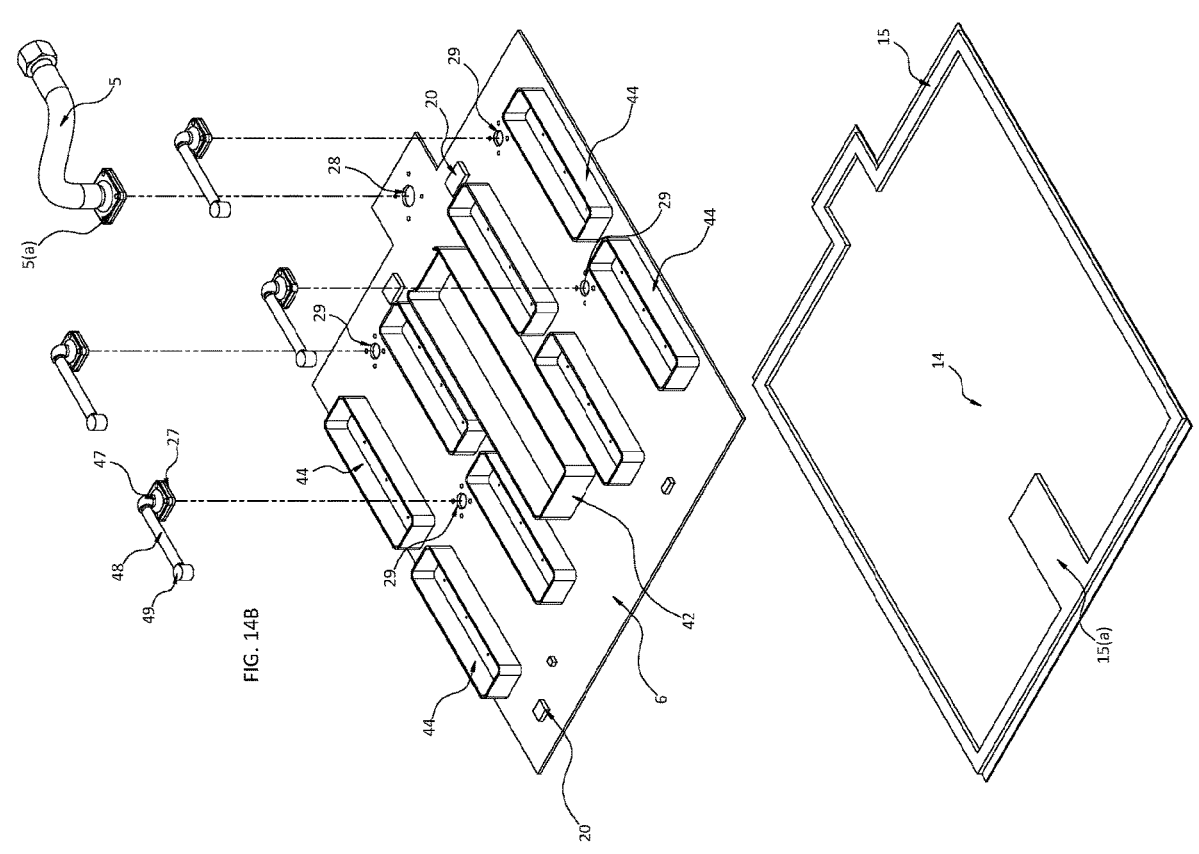
FIG. 14B shows a front isometric exploded view of the manifold part of FIG. 14A.
Figure 14A:
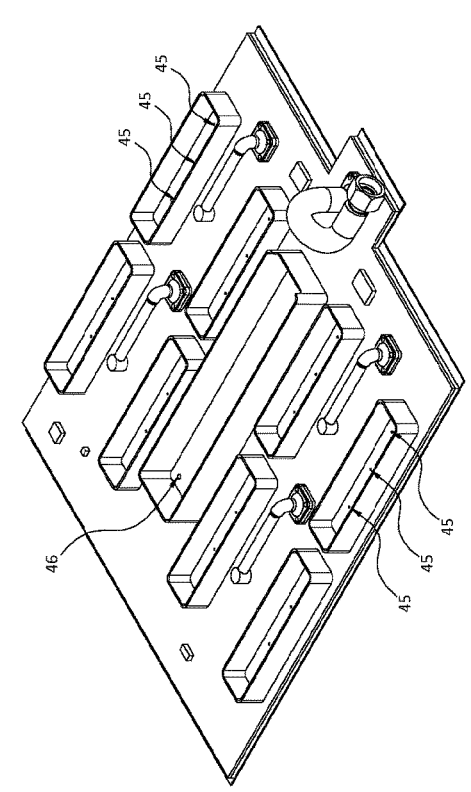
FIG. 14A illustrates a rear isometric view of a manifold part of the embodiment of FIG. 11A.

Referring now to FIG. 14A, there is illustrated a rear isometric view of a manifold part of this embodiment. Reference is further made to FIG. 14B, in which there is shown a front isometric exploded view of the manifold part. The construction of the manifold part and the horizontal heat sinks can thereby be seen more clearly. As with the second embodiment, a gasket extension 15(*a*) is shaped to control flow rate and/or for flow balancing. The shape of the gasket extension 15(*a*) may match the layout of electronic components on the manifold PCB base 6, for example, with the gasket extension 15(*a*) being provided in places where there are no electronic components mounted on the manifold PCB base 6.

In respect of the general terms of the disclosure, for instance discussed above, further optional and/or advantageous features may be considered. For instance, the one or more electrical interfaces may comprise a plurality of regularly-spaced electrical interfaces. Then a plurality of apertures may be (regularly) arranged in the spaces between the plurality of regularly-spaced electrical interfaces. This may be useful for cooling spaced apart circuit boards, for instance memory boards (DIMMs or similar). It will be appreciated that multiple support structures may be provided and/or a support structure may only provide one support structure volume in some cases.

In some embodiments, the electronic component has an upper surface distal the second surface of the circuit board and the internal receptacle volume of the receptacle structure may be arranged to receive heat from the upper surface of the electronic component. This may be such that a portion of the internal receptacle volume proximate the electronic component is defined by a base part of the receptacle structure and/or the upper surface of the electronic component.

Optionally, an underside electronic component (or an electrical interface for receiving such a component) may be provided, mounted on the first surface of the circuit board in the gap.

Each of the at least one electronic component comprises one of: an integrated circuit; a power supply; a RAM component; and a disk drive component (for example, a HDD or SDD). In embodiments, the substrate of the manifold may be partly or fully formed by the chassis. A pump need not be provided; for example, flow of dielectric coolant may be possible by convectional alone (and optionally, convection may combine with a pump to cause flow of the dielectric coolant).

Although specific embodiments have now been described, the skilled person will appreciate that various modifications and alternations are possible. As discussed above, the arrangement of components, heat sinks, support structures and other configurations may be varied, combined or otherwise configured in a range of different ways, of which those disclosed herein are simply examples. The configuration of the electronic device cooled by the heat sink and/or other electronic devices may vary significantly. The exact shape and/or size of the heat sink device may also be modified. The structure of the heat sink device may also change, for example using other multi-part assemblies or as an integrally constructed device.

Although heat sink outlet hose or pipe 32 and joining hose or pipe 34 are used for connecting the PCB-mounted inline component shower 33 and the PCB-mounted end component shower 35, the pipes and showers could be integrated.

The liquid inlet may be placed in different orientations and indeed, multiple liquid inlets may be provided in some embodiments. This allows different nozzle entry points and/or placement. Nozzles can be provided in different numbers, shapes, sizes and spacing.

Although the main flow of liquid coolant out of the receptacle part is described by overflowing, additionally or alternatively, holes may be provided in the receptacle part to allow liquid coolant to flow out to the remainder of the chassis (sealable) internal volume.

A gasket may be omitted in some configurations, for example by integration of the circuit board and gear tray (or other substrate).

The type heat exchanger may be varied. The heat exchanger and/or pump may be configured differently to that shown and/or located in different places (even outside the chassis, in significantly less preferred embodiments). The number and types of pump may also be changed from that shown.

All of the features disclosed herein may be combined in any combination, except combinations where at least some of such features and/or steps are mutually exclusive. In particular, the preferred features of the invention are applicable to all aspects of the invention and may be used in any combination. Likewise, features described in non-essential combinations may be used separately (not in combination).

The invention claimed is:

1. A manifold for distribution of dielectric coolant within a chassis to allow the dielectric coolant to receive heat from at least one electronic component mounted within the chassis, the manifold comprising:
   a circuit board, having first and second opposing surfaces; and
   a substrate, at least partially spaced apart from the circuit board and a gap between the first surface of the circuit board and the substrate being configured to receive and contain the dielectric coolant;
   at least one gasket, arranged to seal between the first surface of the circuit board and the substrate and at least partially define the gap thereby; and
   wherein one or more nozzles are arranged to receive the dielectric coolant from a respective one or more apertures provided in the circuit board or substrate to direct the dielectric coolant to the at least one electronic component.

2. The manifold of claim 1, wherein the at least one electronic component is mounted on or above the second surface of the circuit board.

3. The manifold of claim 1, further comprising:
   one or more electrical interfaces, each of the one or more electrical interfaces being mounted on the circuit board so as to receive a respective electronic component.

4. The manifold of claim 3, wherein the one or more electrical interfaces comprise a plurality of regularly-spaced electrical interfaces, the one or more apertures comprising a plurality of apertures arranged in the spaces between the plurality of regularly-spaced electrical interfaces.

5. The manifold of claim 1, further comprising:
   one or more fluid connectors, each of the one or more fluid connectors being arranged on the second surface of the circuit board to receive the dielectric coolant from a respective at least one aperture of the one or more apertures.

6. The manifold of claim 1, further comprising:
   a support structure, mounted on or to the circuit board to provide one or more support structure volumes, each support structure volume configured for a respective one or more electronic components of the at least one electronic component to be mounted within, the support structure being cooperative with the circuit board such that the dielectric coolant received via the one or more apertures accumulates within the one or more support structure volumes.

7. The manifold of claim 6, wherein the support structure is arranged such that the dielectric coolant received via the one or more apertures accumulates within the at least one support structure volume and overflows the at least one support structure volume.

8. The manifold of claim 6, wherein the manifold further comprises one or more electrical interfaces, each of the one or more electrical interfaces being mounted on the circuit board so as to receive a respective electronic component and wherein each of the one or more electrical interfaces is mounted on the circuit board with reference to a respective support structure volume so as to receive the one or more electronic components to be mounted within the support structure volume or wherein the one or more apertures comprise a plurality of apertures, more than one of the plurality of apertures being arranged to open into at least one of the one or more support structure volumes.

9. The manifold of claim 1, wherein the at least one electronic component comprises an electronic component mounted on the second surface of the circuit board or on a further circuit board, the manifold further comprising:
   a receptacle structure, defining an internal receptacle volume adjacent the electronic component; and
   a receptacle conduit, arranged to provide the dielectric coolant from at least one aperture of the one or more apertures to the internal receptacle volume, such that the dielectric coolant accumulates in the internal receptacle volume, for receiving heat from the electronic component.

10. The manifold of claim 9, wherein the internal receptacle volume is configured such that accumulated dielectric coolant overflows the internal receptacle volume.

11. The manifold of claim 9, wherein the electronic component has an upper surface distal the second surface of the circuit board and the internal receptacle volume of the receptacle structure is arranged to receive heat from the upper surface of the electronic component or wherein electronic component is mounted perpendicular to the second surface of the circuit board and the internal receptacle volume of the receptacle structure is arranged to receive heat from a surface of the electronic component.

12. The manifold of claim 1 further comprising:
   an underside electronic component, mounted on the first surface of the circuit board in the gap.

13. The manifold of claim 1, further comprising:
   a coolant inlet, arranged to receive a conduit carrying the dielectric coolant and transfer the dielectric coolant to the gap.

14. The manifold of claim 13, wherein the coolant inlet is mounted on a respective hole in the circuit board or the substrate, to allow the dielectric coolant to flow from one or more fluid connectors to the gap.

15. The manifold of claim 1, wherein each of the at least one electronic component comprises one of: an integrated circuit; a power supply; a RAM component; and a disk drive component.

16. A cooling module, comprising:
   a chassis, defining a chassis internal volume;
   a plurality of electronic components mounted in the chassis internal volume;

the manifold for distribution of dielectric coolant according to claim 1; and a heat exchanger arranged to receive the dielectric coolant, transfer heat from the received dielectric coolant to a heat sink and direct the dielectric coolant to the manifold.

17. The cooling module of claim 16, further comprising:

a pump, arranged to cause the dielectric coolant to flow from the heat exchanger to the manifold.

18. The cooling module of claim 16, wherein the manifold is configured for the dielectric coolant to flow out and accumulate in the chassis internal volume or wherein the chassis internal volume comprises a base, the circuit board of the manifold being oriented parallel or perpendicular to the base.

19. The cooling module of claim 16, wherein the heat exchanger is within the chassis or wherein the heat sink comprises a secondary liquid coolant, the secondary liquid coolant being received at the heat exchanger from outside the cooling module.

* * * * *